(12) United States Patent
Boyd et al.

(10) Patent No.: US 7,504,136 B2
(45) Date of Patent: Mar. 17, 2009

(54) METHOD AND SYSTEM FOR FORMING A FILM OF MATERIAL USING PLASMON ASSISTED CHEMICAL REACTIONS

(75) Inventors: David A. Boyd, Pasadena, CA (US); Mark Brongersma, Redwood City, CA (US); Leslie Greengard, New York, NY (US)

(73) Assignee: California Institute of Technology, Pasadena, CA (US)

( * ) Notice: Subject to any disclaimer, the term of this patent is extended or adjusted under 35 U.S.C. 154(b) by 763 days.

(21) Appl. No.: 11/006,457

(22) Filed: Dec. 6, 2004

(65) Prior Publication Data

US 2005/0233078 A1 Oct. 20, 2005

Related U.S. Application Data

(60) Provisional application No. 60/529,869, filed on Dec. 15, 2003.

(51) Int. Cl.
| | |
|---|---|
| H05H 1/24 | (2006.01) |
| C23C 16/00 | (2006.01) |
| C23C 8/00 | (2006.01) |
| C23C 14/28 | (2006.01) |
| H05H 1/02 | (2006.01) |
| H05H 1/00 | (2006.01) |
| H05B 6/00 | (2006.01) |

(52) U.S. Cl. ............... 427/569; 427/248.1; 427/570; 427/585; 427/572; 427/586; 427/595

(58) Field of Classification Search .......... None
See application file for complete search history.

(56) References Cited

U.S. PATENT DOCUMENTS

| | | | |
|---|---|---|---|
| 2,981,877 A | 4/1961 | Noyce | |
| 5,147,611 A * | 9/1992 | Stout et al. | 422/78 |
| 5,165,909 A * | 11/1992 | Tennent et al. | 423/447.3 |
| 5,395,663 A | 3/1995 | Tabata et al. | |
| 6,765,949 B2 * | 7/2004 | Chang | 373/2 |

(Continued)

FOREIGN PATENT DOCUMENTS

JP        10-256257 A       3/1995

OTHER PUBLICATIONS

Hirsch et al., Nanoshell-Mediated Near-Infrared Thermal Therapy of Tumors Under Magnetic Resonance Guidance, PNAS, 2003, v. 100, No. 23, pp. 13549-13554.

*Primary Examiner*—Timothy Meeks
*Assistant Examiner*—Kelly M. Stouffer
(74) *Attorney, Agent, or Firm*—Townsend and Townsend and Crew LLP

(57) ABSTRACT

A method for forming a film of material using chemical vapor deposition. The method includes providing a substrate comprising a pattern of at least one metallic nanostructure, which is made of a selected material. The method includes determining a plasmon resonant frequency of the selected material of the nanostructure and exciting a portion of the selected material using an electromagnetic source having a predetermined frequency at the plasmon resonant frequency to cause an increase in thermal energy of the selected material. The method includes applying one or more chemical precursors overlying the substrate including the selected material excited at the plasmon resonant frequency and causing selective deposition of a film overlying at least the portion of the selected material.

53 Claims, 13 Drawing Sheets

U.S. PATENT DOCUMENTS

| | | |
|---|---|---|
| 2002/0112814 A1 | 8/2002 | Hafner et al. |
| 2002/0127170 A1* | 9/2002 | Hong et al. .............. 423/447.3 |
| 2002/0160111 A1 | 10/2002 | Sun et al. |
| 2003/0174384 A1 | 9/2003 | Halas et al. |
| 2004/0079195 A1 | 4/2004 | Perry et al. |

* cited by examiner

METHOD AND SYSTEM FOR FORMING A FILM OF MATERIAL USING PLASMON ASSISTED CHEMICAL REACTIONS

CROSS-REFERENCE TO RELATED APPLICATIONS

This present application claims priority to U.S. Provisional Ser. No. 60/529,869 filed Dec. 15, 2003, commonly assigned and hereby incorporated by reference for all purposes.

STATEMENT AS TO RIGHTS TO INVENTIONS MADE UNDER FEDERALLY SPONSORED RESEARCH OR DEVELOPMENT

N/A

BACKGROUND OF THE INVENTION

The present invention is directed to processing materials and in particular micro or nanostructures and their applications. More particularly, the present invention provides methods and resulting structures for forming nano and micro structures using a deposition technique for a wide variety of applications. As merely an example, such deposition techniques can be applied to formation of one or more films in the manufacture of electronic devices, such as integrated circuits. But it would be recognized that the invention has a much broader range of applicability. The present invention may be used for etching, enhancing chemical reactions, and the like. Additionally, the invention can be applied to various fields including life sciences, chemistry, petrochemical, electronics, and others.

Over the years, microelectronics have proliferated into many aspects of modern day life. In the early days, Robert N. Noyce invented the integrated circuit, which is described in "Semiconductor Device-and-Lead Structure" under U.S. Pat. No. 2,981,877. Integrated circuits evolved from a handful of electronic elements into millions and even billions of components fabricated on a small slice of silicon material. Such integrated circuits have been incorporated into and control many conventional devices, such as automobiles, computers, medical equipment, and even children's toys.

Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Increasing circuit density has not only improved the complexity and performance of integrated circuits but has also provided lower cost parts to the consumer.

An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is chemical vapor deposition, commonly called CVD. More particularly, CVD has been regarded as one of the most cost-effective means of high-throughput, high-quality thin film deposition for the manufacture of electronic, optoelectronic, and MEMS devices. In a conventional CVD reactor, for example, vaporized chemical precursors are in contact with a heated substrate, and deposition is the result of chemical reactions occurring on or very near the surface of the heated substrate. The composition of the deposit depends on the chemical precursors and the reactor's environment. For example, using a titanium precursor one could produce a metallic, titanium film on the substrate, or with a suitable partial pressure of oxygen in the reactor, a titania, $TiO_2$ film could be formed. To form electronic circuits, CVD is often used with lithographic processes. For example, a film of material is deposited using CVD. Structures are etched from the film. The deposition and etch process can be repeated to form complex structures.

Other CVD techniques have also been proposed. An example of such CVD technique is Laser Assisted CVD. Unlike conventional CVD where the entire substrate is heated, Laser Assisted CVD (LCVD) uses a focused laser to locally heat a small spot on the substrate to suitable CVD reaction temperatures. Typical laser spot sizes are on the order of several microns. Because of the localized heating, the reaction pathway in the vapor is three dimensional, and the growth rates are several orders of magnitude higher than traditional CVD. LCVD growth rates of 5-20 microns/sec are often typical. The laser spots, however, often require a high power laser source, which is not efficient and costly. By translating the focus of the beam, it is possible to write lines, dots, and rods. Although CVD and LCVD have had certain success, many limitations still exist. That is, line widths associated with these processes often cannot be less than a predetermined amount, i.e., diffraction limit of light. Additionally, film quality often degrades as line widths become smaller. These and other limitations will be described in further detail throughout the present specification and more particularly below.

From the above, it is seen that an improved technique for processing materials is desired.

BRIEF SUMMARY OF THE INVENTION

According to the present invention, techniques directed to processing materials and in particular to micro or nanostructures and their applications are provided. More particularly, the present invention provides methods and resulting structures for forming nano and micro structures using a deposition technique for a wide variety of applications. As merely an example, such deposition techniques can be applied to formation of one or more films in the manufacture of electronic devices, such as integrated circuits. But it would be recognized that the invention has a much broader range of applicability. The present invention may be used for etching, enhancing chemical reactions, and the like. Additionally, the invention can be applied to various fields including life sciences, chemistry, petrochemical, electronics, and others.

We understand that many materials synthesis methods often require energy in the form of heat. As an example, chemical vapor deposition is a common technique for materials synthesis. Such methods often apply the heat generated by photon-electron interactions in nanometer sized structures as a source of heat for such chemical vapor deposition. In particular, the invention includes use of selected frequencies and/or frequency ranges of electromagnetic radiation in the form of light to control the relative temperature of nanometer sized particles by which material is synthesized. Preferably, the present invention also allows use of simple light sources such as a laser and conventional optics to selectively heat the structures with substantially lower power densities than is otherwise possible with other techniques according to a specific embodiment. It allows for spatial control of material synthesis reactions on the scale of nanometers in certain embodiments. It also allows a high degree of temporal control of the temperature of the synthesis process. These and other features will be described throughout the present specification and more particularly below.

In a specific embodiment, the present invention provides a method for forming a film of material using plasmon assisted chemical vapor deposition or like process. The method includes providing a substrate, which has a surface region. Preferably, the substrate is a silicon wafer, Group III/V materials, silicon on insulator, germanium, quartz, glass, or others, including multilayered, and the like. The method includes forming one or more particles (e.g., metallic, semiconductor, organic, insulator) overlying a portion of the surface region. Preferably, the one or more particles have a thermal characteristic, e.g., the ability to maintain a thermal gradient between the particle itself and the surrounding environment. Preferably, the particles are strong absorbers of the incident radiation via plasmon excitation or like (much stronger than the surrounding media so that the radiation is absorbed more strongly by a determined amount by the particles than the surrounding media) according to a specific embodiment. Therefore, the particles can be heated relative to their surroundings. The stronger absorption may be quantified by the application of Maxwell's Equations, which govern the behavior of electromagnetic radiation, to the particles and the surrounding medium. In particular, the application of Maxwell's equations to the scattering from small participles can be found in Mie theory and its extensions (where the terms Mie theory without explicit recitation of its extensions as described herein will include its extensions according to a specific embodiment), and this theory can be used to characterize the absorption of the electromagnetic energy by the particles. The effect of absorption may also be measured empirically by spectroscopy.

The method includes applying a reactive species (e.g., any reactive element or compound, gas, liquid, solid) within a vicinity of the one or more particles and irradiating the one or more particles with electromagnetic radiation (e.g., laser source, other energy source), which has a pre-selected frequency and/or frequency ranges. The method includes increasing a temperature of the one or more particles having the thermal characteristic to at least a selected temperature (e.g., reaction temperature) from an influence of at least the electromagnetic radiation having the pre-selected frequency. The method causes a chemical reaction of the reactive species from at least the increase in the temperature of the one or more particles to initiate formation of a film of material from the reactive species. In a specific embodiment, the term "particle" or "particles" can form a pre-existing structure with a determined spatial and geometric configuration, which we will call a "pre-form" according to a specific embodiment.

In an alternative specific embodiment, the present invention provides an alternative method for causing a chemical reaction using electromagnetic radiation. The method includes providing one or more particles. Preferably, the one or more particles have a thermal characteristic. The method includes applying a reactive species within a vicinity of the one or more particles and irradiating the one or more particles with electromagnetic radiation, which has a pre-selected frequency. The method includes increasing a temperature of the one or more particles having the thermal characteristic to at least a selected temperature from an influence of at least the electromagnetic radiation having the pre-selected frequency and causing a chemical reaction of the reactive species from at least the increase in the temperature of the one or more particles to initiate formation of a material from the reactive species. In a specific embodiment, the term "particle" or "particles" can form a pre-existing structure with a determined spatial and geometric configuration, which we will call a "pre-form" according to a specific embodiment.

In yet an alternative embodiment, the present invention provides a method for processing materials using chemical reactions. In a specific embodiment, the method provides for material deposition by initiating a chemical reaction using particle (e.g., pre-form) heating using electromagnetic radiation. The method includes irradiating one or more particles with an electromagnetic radiation source, the electromagnetic radiation source having a predetermined frequency. The method includes causing an increase in thermal energy on a portion of one or more of the particles to elevate a local temperature on the portion of the one or more particles. The increase in thermal energy is sufficient to initiate a chemical reaction of one or more species within a vicinity of the portion of the one or more particles. In a specific embodiment, the term "particle" or "particles" can form a pre-existing structure with a determined spatial and geometric configuration, which we will call a "pre-form" according to a specific embodiment.

Still further, the present invention provides a method for forming a film of material using chemical vapor deposition. The method includes providing a substrate comprising a pattern (e.g., pre-form) of at least one metallic nanostructure, which is made of a selected material. The method includes determining a plasmon resonant frequency of the selected material of the nanostructure and exciting a portion of the selected material using an electromagnetic source having a predetermined frequency at the plasmon resonant frequency to cause an increase in thermal energy of the selected material. The method includes applying one or more chemical precursors overlying the substrate including the selected material excited at the plasmon resonant frequency and causing selective deposition of a film overlying at least the portion of the selected material.

Depending upon the embodiment, the present invention also provides one or more of the following features, which are further described throughout the present specification and more particularly below.

1. The present invention provides a method using plasmon excitation in metallic nanostructures as a means for creating local temperature profiles or inducing localized heating which are sufficient to initiate chemical reactions according to a specific embodiment.

2. Plasmon excitation in metallic nanostructures to locally heat a perform including the metallic nanostructures on a substrate in a CVD reactor according to a specific embodiment is also included. A brief sequence of steps can be provided as follows:

a. Developing a template of metallic nanostructures (which we will call a pre-form), such as a regular array of gold particles by any effective means, including but not limited to electron beam lithography and nano-imprinting or alternatively providing a substrate on which a pattern of metallic particles (e.g., regular array, random dispersion, or any layout) (i.e., pre-form) has been formed.

b. Compute plasmon resonant frequency (e.g., or frequency range) for given material, spacing, particle size, etc.

c. Use light source in appropriate frequency range to induce heating in nanostructures. This can be accomplished, for example, by sweeping a focused laser source across the substrate or by designing a diffuse source, which can excite all metallic particles simultaneously.

d. Carry out step (c) inside a CVD reactor so that vaporized chemical precursors are in contact with the heated substrate, and deposition results in a pattern determined by the preform. The actual material deposited depends on the chemical precursors and other details of the environment.

3. Plasmon-based CVD for the creation of structured ferroelectric thin films according to an alternative specific embodiment is also included.

4. Specific applications such as any CVD process can now be used with better spatial control than in conventional CVD reactors. Moreover, better process control can also be achieved by controlling the light source—heating is induced more rapidly and dissipates more rapidly as well. Preferably, the pattern of deposition is controlled by a pattern of the underlying pre-form and the manner in which electromagnetic radiation is used to generate the heating effect on the pre-form according to a specific embodiment.

Depending upon the embodiment, one or more of these features may be included. Of course, one of ordinary skill in the art would recognize many variations, modifications, and alternatives.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of tens of nanometers and less. Additionally, the invention can provide for selective film formation of line widths ranging from about one half of a micron and less or less than one nanometer depending upon the embodiment. Moreover, the present invention includes methods and resulting structures that can be implanted using much tighter controls that conventional processing techniques such as conventional chemical vapor deposition according to preferred embodiments. Still further, the present invention provides a method and resulting structure where plasmon assisted treatment initiates formation of a film of material with control over a resulting film on a pre-form. Such film has a similar or same geometry as the pre-form and electromagnetic radiation used to excite the pre-form is provided using selected temporal control according to a specific embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to processing materials and in particular directed to micro or nanostructures and their applications are provided. More particularly, the present invention provides methods and resulting structures for forming nano and micro structures using a deposition technique for a wide variety of applications. As merely an example, such deposition techniques can be applied to formation of one or more films in the manufacture of electronic devices, such as integrated circuits. But it would be recognized that the invention has a much broader range of applicability. The present invention may be used for etching, enhancing chemical reactions, and the like. Additionally, the invention can be applied to various fields including life sciences, chemistry, petrochemical, electronics, and others.

A method for fabricating a film of material using a plasmon resonant frequency process according to an embodiment of the present invention may be outlined as follows.

1. Provide substrate, which has a surface region.

2. Form one or more particles (having a thermal characteristic) overlying a portion of the surface region (or provide a substrate that has one or more particles overlying (or embedded in) (e.g., pre-form) a portion of the surface region to replace steps 1 and 2 above);

3. Apply a reactive species within a vicinity of the one or more particles;

4. Irradiate the one or more particles with electromagnetic radiation, which has a pre-selected frequency, in a selected spatial region;

5. Increase a temperature of the one or more particles having the thermal characteristic to at least a selected temperature from an influence of at least the electromagnetic radiation having the pre-selected frequency;

6. Cause a chemical reaction of the reactive species from at least the increase in the temperature of the one or more particles to initiate formation of a film of material from the reactive species; and 7. Perform other steps, as desired.

The above sequence of steps provides a method for forming a film of material according to an embodiment of the present invention. As shown, the method uses a combination of steps including a way of forming a film of material using electromagnetic radiation and one or more particles overlying a surface region. Other alternatives can also be provided where steps are added, one or more steps are removed, or one or more steps are provided in a different sequence without departing from the scope of the claims herein. Further details of the present method can be found throughout the present specification and more particularly below.

Figure 1:
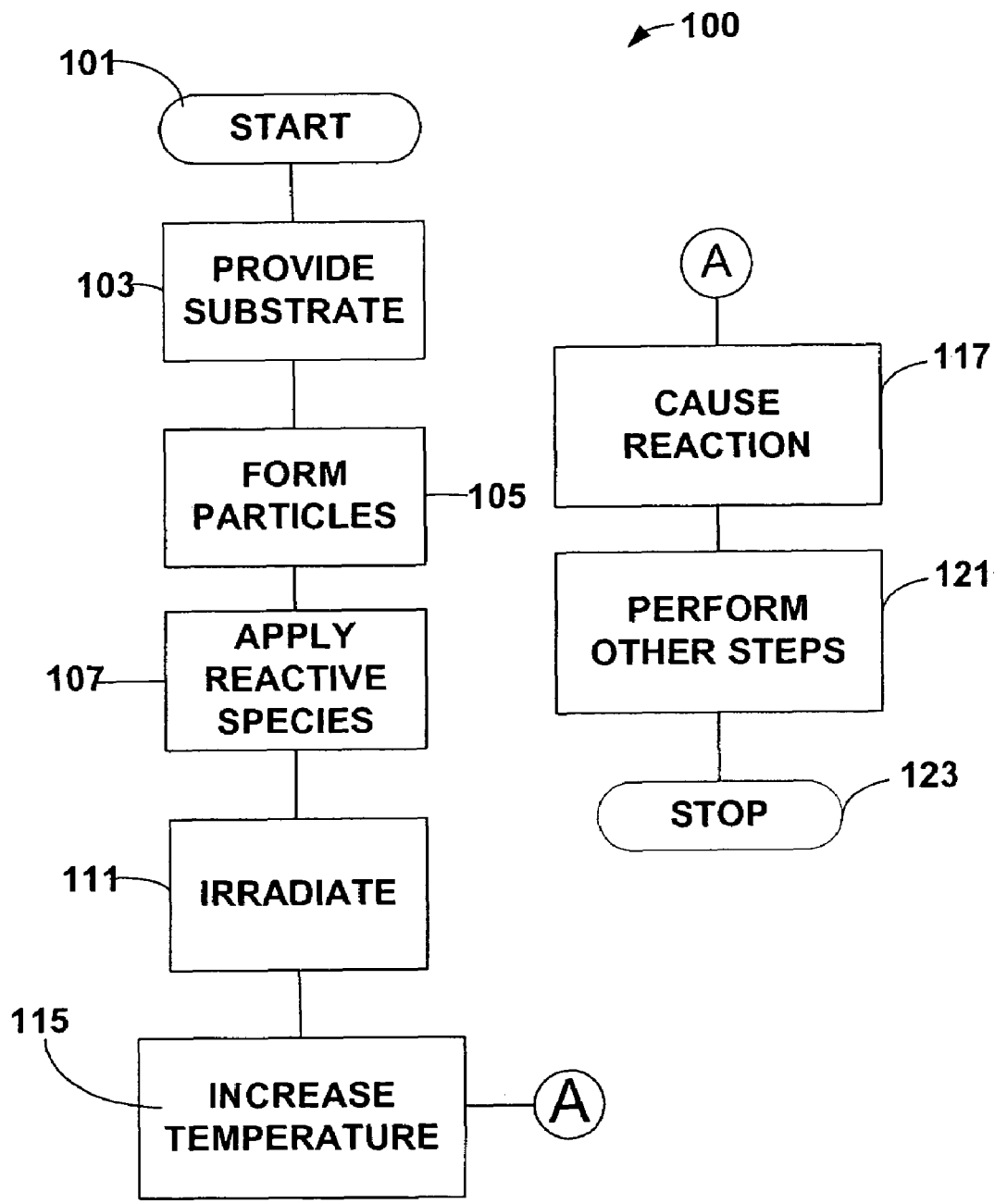
FIG. 1 is a simplified flow diagram of a deposition method according to an embodiment of the present invention.
Figure 2:
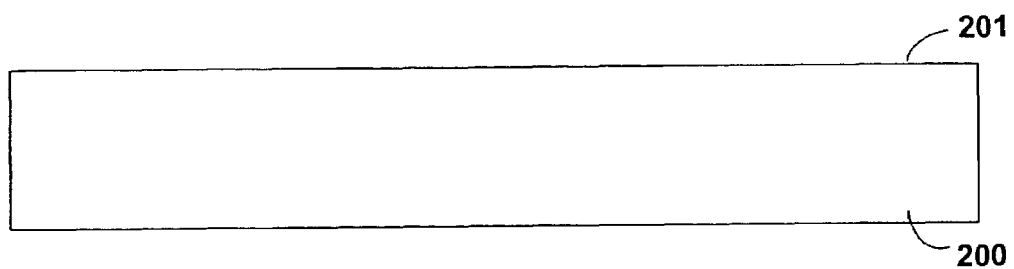
FIGS. 2 through 4 are simplified cross-sectional view diagrams of a deposition method according to an embodiment of the present invention.
Figure 3:
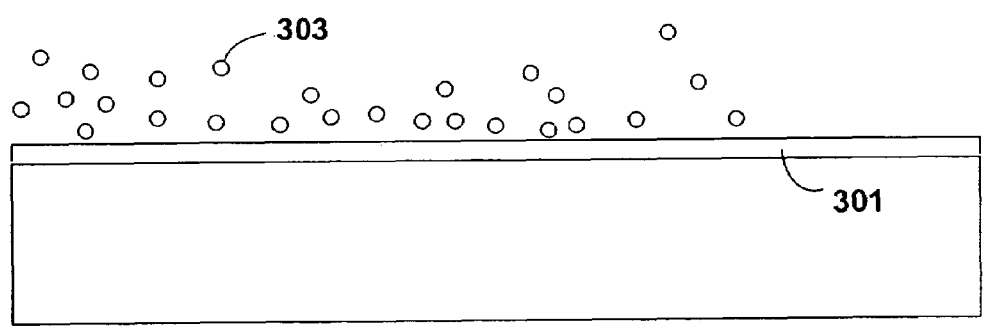
Figure 4:
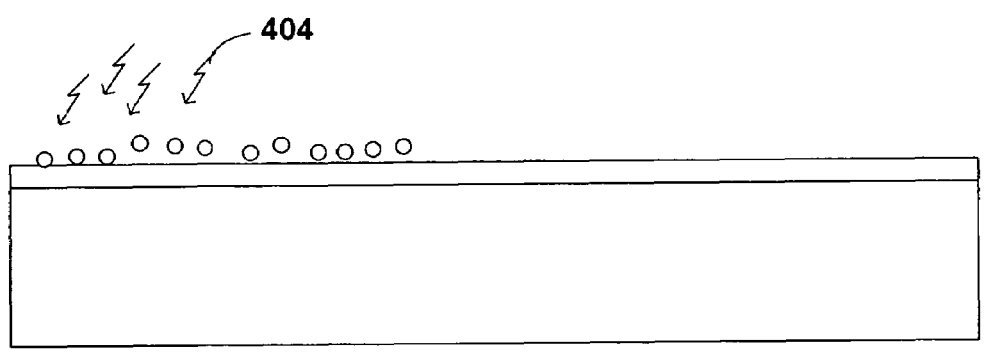

FIG. 1 is a simplified flow diagram of a deposition method according to an embodiment of the present invention. This flow diagram is merely an illustration and should not unduly limit the scope of the claims herein. One of ordinary skill in the art would recognize many variations, modifications, and alternatives. FIGS. 2 through 4 are simplified cross-sectional view diagrams of a deposition method according to an embodiment of the present invention. These diagrams are merely examples, which should not unduly limit the scope of the claims herein. One of ordinary skill in the art would recognize many variations, alternatives, and modifications. As shown, the method begins with start, step 101, which provides a method for forming a film of material using plasmon assisted chemical vapor deposition or like process.

The method includes providing a substrate (step 103) 200, which has a surface region 201, which is illustrated by FIG. 2. Preferably, the substrate is a silicon wafer. Other types of substrates include conductive materials, insulating materials, other semiconductor materials, multilayered materials, and the like. The conducting materials can include, but are not limited to, doped semiconductor materials, doped glasses, metals, and other suitable materials. The insulating materials include, but are not limited to, glass, quartz, ceramics, and any oxide or nitrides or other materials with insulating characteristics, e.g., thermal, electrical. The semiconductor materials include, but are not limited to, silicon, germanium, Group III/V, and others The surface region can be flat, shaped, or any combination of these. The surface region can be patterned or free from any patterns. Optionally, the method maintains the substrate at a predetermined temperature. Preferably, the predetermined temperature is below a reaction temperature of the one or more particles and the reactive species, which will be described in further detail below. Of course, one of ordinary skill in the art would recognize many variations, modifications, and alternatives.

The method includes forming (step 105) one or more particles 301 overlying a portion of the surface region and/or providing a substrate of metallic particles having a pre-form thereon and/or embedded within a portion of the substrate according to a specific embodiment. Preferably, the one or more particles have a thermal characteristic, e.g., chemical activation energy. The one or more particles form a layer of material or materials. The one or more particles serve as a precursor for forming a film of material. In a specific embodiment, the one or more particles can be a semiconductor material, an insulating material, a metal, an organic material, or any combination of these. Preferably, the one or more particles are a metallic material. The metallic material can be selected from gold (Au), copper (Cu), silver (Ag), titanium (Ti), aluminum (Al), palladium (Pd), platinum (Pt), rhodium (Rh), iridium (Ir), iron (Fe), tungsten (W), nickel (Ni), and other metals listed in the Periodic Table, any combination of these, and the like. In a specific embodiment, the one or more particles is characterized by a length of one nanometers to about 100 nanometers, although other dimensions can also exist. The one or more particles can also include a single particle, multiple particles, strands of particles, including wires, and any combination of these. The particles can form a pattern or also be free from any patterns on the surface of the substrate. Of course, one of ordinary skill in the art would recognize many variations, alternatives, and modifications.

The method includes applying a reactive species 303 (or step 107) within a vicinity of the one or more particles, as illustrated by FIG. 3. Preferably, the reactive species is on and in contact with the film of particles. The reactive species forms a chemical reaction with the one or more particles upon a given or selected temperature. The temperature is an activation energy associated with a reaction between the one or more particles and reactive species. The activation energy is a minimum level of energy required to initiate the reaction to form a product, which is for a film of material. In a specific embodiment, the reactive species is in gaseous form, liquid form, a plasma, solid form, or any combination of these. Preferably, electromagnetic energy is used to initiate the reaction, as will be described more specifically below.

The method includes irradiating 404 (step 111) the one or more particles with electromagnetic radiation, which is characterized by a pre-selected frequency or frequencies, referring to FIG. 4. The electromagnetic radiation can be from a patterned or flood source. The electromagnetic radiation can be derived from a laser source, such as HeNe, argon, carbon dioxide, any suitable lamp, which is flood or patterned, solar power, and the like. Preferably, the pre-selected frequency ranges from about 200 nm to about 30,000 nm depending upon the specific embodiment. The method includes increasing (step 115) a temperature of the one or more particles having the thermal characteristic to at least a selected temperature from an influence of at least the electromagnetic radiation having the pre-selected frequency. In a specific embodiment, the influence is a resonating effect and/or photon-electronic interaction of the one or more particles, which causes an increase in thermal energy of the one or more particles. Here, the method causes (step 117) a chemical reaction of the reactive species from at least the increase in the temperature of the one or more particles to initiate formation of a film of material from the reactive species. In a preferred embodiment, the increased temperature causes the initiation of the reaction since the activation energy associated with the reaction has been overcome in the spatial region associated with the one or more particles and/or pre-form structures. Other spatial regions outside of the pre-form are maintained below the activation energy and cannot initial the chemical reaction, which maintains such regions free from any film formation according to a specific embodiment. In a preferred embodiment, the method forms the film of material to a selected thickness. Depending upon the embodiment, other steps, step 212, can be included. The method stops, at step 123.

The above sequence of steps provides a method for forming a film of material according to an embodiment of the present invention. As shown, the method uses a combination of steps including a way of forming a film of material using electromagnetic radiation and one or more particles overlying a surface region. Other alternatives can also be provided where steps are added, one or more steps are removed, or one or more steps are provided in a different sequence without departing from the scope of the claims herein.

As merely an example, the present invention provides an alternative method for causing a chemical reaction using electromagnetic radiation, which is somewhat similar to the above embodiment. The method includes providing one or more particles. Preferably, the one or more particles have a thermal characteristic. The one or more particles can be provided on a substrate, within a substrate, or within a fluid medium. The fluid medium can be a liquid, a gas, or a vapor, or any combination of these, depending upon the embodiment. The liquid can be an organic, a petroleum based material, a metal, or water based fluid, including pure water, salt, etc. The gas can be an organic, a petroleum based material, or a water based material, a non-reactive material, an inert gas (e.g., nitrogen, argon), air (e.g., oxygen, nitrogen), rich oxygen bearing environments, any combination of these, and the like. The vapor can be an organic, a petroleum based fluid, a water based material, air, rich oxygen bearing environments, an inert environment, a non-reactive environment, any combination of these, and the like. Of course, there can also be any combination of the above, and others.

Next, the method includes applying a reactive species within a vicinity of the one or more particles and irradiating the one or more particles with electromagnetic radiation, which has a pre-selected frequency. The method includes increasing a temperature of the one or more particles having the thermal characteristic to at least a selected temperature from an influence of at least the electromagnetic radiation having the pre-selected frequency. The method includes causing a chemical reaction of the reactive species from at least the increase in the temperature of the one or more particles to initiate formation of a material from the reactive species. Alternatively, electromagnetic radiation can be provided on the reactive species to initiate formation of a material. Alternatively, electromagnetic radiation can be provided on the reactive species and the one or more particles to initiate the formation of the film depending upon the specific embodiment. Of course, one of ordinary skill in the art would recognize other variations, modifications, and alternatives.

The above sequence of steps provides a method for forming a film of material according to an embodiment of the present invention. As shown, the method uses a combination of steps including a way of forming a film of material using electromagnetic radiation and one or more particles overlying a surface region or within a fluid, solid, or any combination of these. Other alternatives can also be provided where steps are added, one or more steps are removed, or one or more steps are provided in a different sequence without departing from the scope of the claims herein. Other methods according to embodiments of the present invention may be provided throughout the present specification and more specifically below.

A method for forming a film of material using chemical vapor deposition according to an embodiment of the present invention may be outlined as follows.

1. Provide a substrate comprising a pattern of at least one metallic nanostructure, which is made of a selected material;
2. Determine a plasmon resonant frequency of the selected material of the nanostructure;
3. Excite a portion of the selected material using an electromagnetic source having a predetermined frequency at the plasmon resonant frequency;
4. Cause an increase in thermal energy of the selected material;
5. Apply one or more chemical precursors overlying the substrate including the selected material excited at the plasmon resonant frequency;
6. Cause selective deposition of a film overlying at least the portion of the selected material; and
7. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 5:
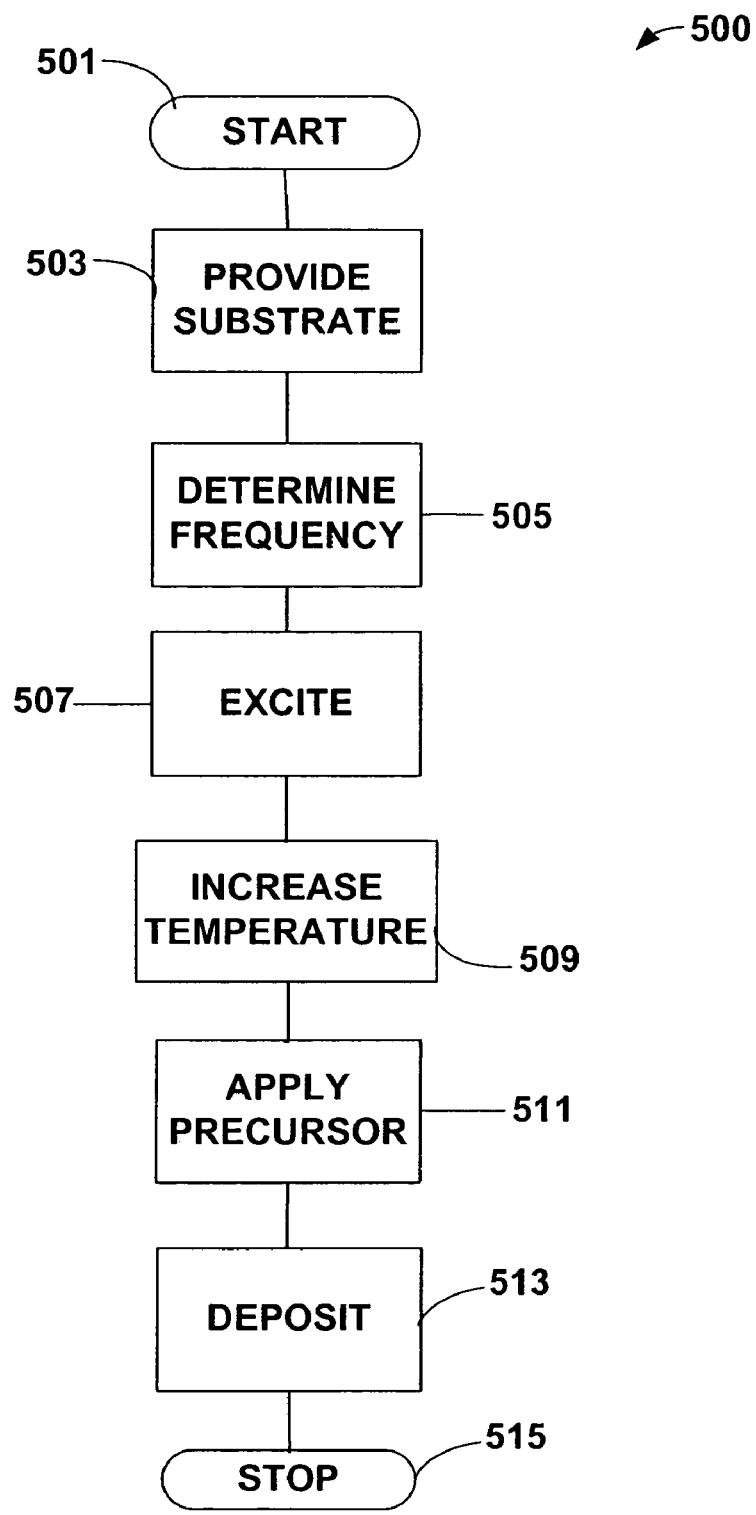
FIG. 5 is a simplified flow diagram of an alternative deposition method according to an embodiment of the present invention.
Figure 6:
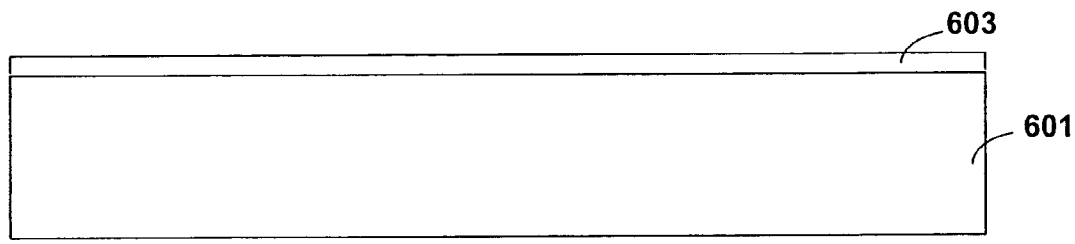
FIGS. 6 through 8 are simplified cross-sectional view diagrams of the alternative deposition method according to an embodiment of the present invention.
Figure 7:
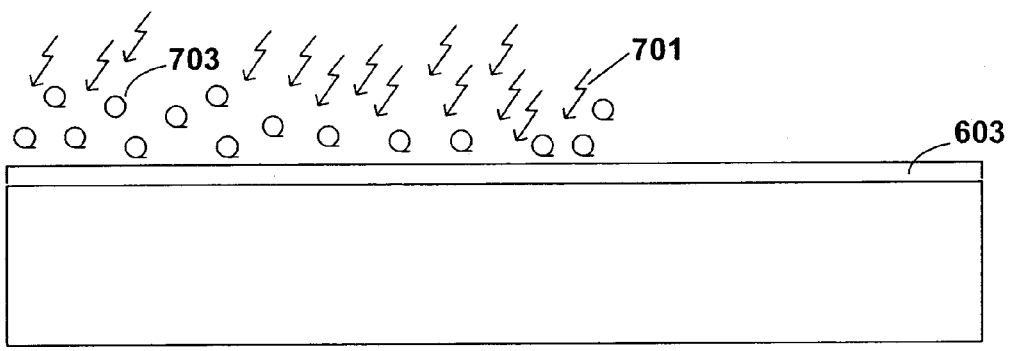
Figure 8:
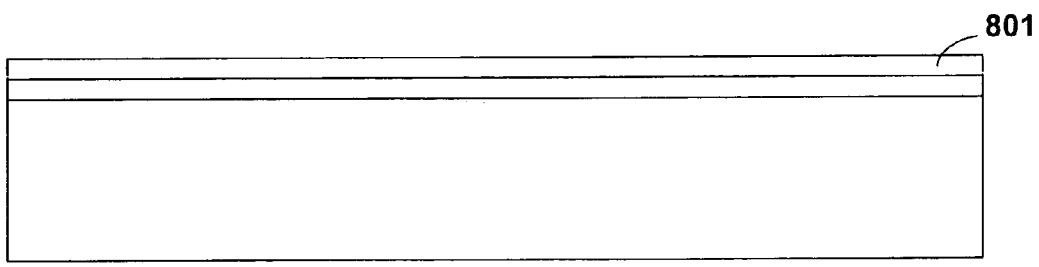

FIG. 5 is a simplified flow diagram of an alternative deposition method according to an embodiment of the present invention. This diagram is merely an example, which should not unduly limit the scope of the claims herein. One of ordinary skill in the art would recognize many variations, alternatives, and modifications. FIGS. 6 through 8 are simplified cross-sectional view diagrams of the alternative deposition method according to an embodiment of the present invention. These diagrams are merely examples, which should not unduly limit the scope of the claims herein. One of ordinary skill in the art would recognize many variations, alternatives, and modifications. As shown using the simplified flow diagram of FIG. 5, the present method 500 provides a method for forming a film of material using chemical vapor deposition, which begins at start, step 501.

The method includes providing (step 503) a substrate 601 comprising a pattern 603 of at least one metallic nanostructure, which is made of a selected material. Preferably, the substrate is a silicon wafer. Other types of substrates include conductive materials, insulating materials, other semiconductor materials, multilayered materials, and the like. The conducting materials can include, but are not limited to any of those mentioned herein, as well as outside of the specification. The insulating materials include, but are not limited to, any of those mentioned herein, as well as outside of the specification. The semiconductor material can include silicon, germanium, any Group III/V materials, and any combination of these, and the like, as well as others mentioned herein. The metallic material can be selected from gold (Au), copper (Cu), silver (Ag), titanium (Ti), aluminum (Al), palladium (Pd), platinum (Pt), rhodium (Rh), iridium (Ir), iron (Fe), tungsten (W), nickel (Ni), and other metals listed in the Periodic Table, any combination of these, and the like. In a specific embodiment, the patterned nanostructure is characterized by a length of one nanometers to about 100 nanometers, although other dimensions can also exist. Optionally, the method maintains the substrate and patterned nanostructure at a predetermined temperature. Preferably, the predetermined temperature is below a reaction temperature of the patterned nanostructure with a reactive species, which will be described in further detail below. Of course, one of ordinary skill in the art would recognize many variations, modifications, and alternatives.

The method includes determining (step 505) a plasmon resonant frequency of the selected material of the nanostructure. In a specific embodiment, the plasmon resonant frequency is a frequency at which there are collective oscillations of the conductive electrons. As an example, the plasmon resonant frequency can be derived from Mie Theory if the optical properties of the particles and the surrounding media are known. It may also be necessary for complicated structures, to know the geometry and or the arrangement of the particles. The plasmon resonant frequency may also be measured empirically by spectroscopic methods. Of course, one of ordinary skill in the art would recognize other variations, modifications, and alternatives. Additionally, such definition should not be construed as unduly limiting the scope of the invention herein.

Next, the method includes exciting (step 507) a portion of the selected material using an electromagnetic source 701 having a predetermined frequency at the plasmon resonant frequency, as illustrated by the simplified diagram of FIG. 7. The electromagnetic radiation can be from a patterned or flood source. The electromagnetic radiation can be derived from a laser source, such as HeNe, Ar++, or a laser diode, among others. Preferably, the pre-selected frequency ranges from about 200 nm to about 30,000 nm depending upon the specific embodiment. Note that continuous power lasers (CW) may be preferable to pulsed lasers. Of course, there may be other variations, modifications, and alternatives.

The method includes causing an increase (step 509) in thermal energy of the selected material, which is associated with the electromagnetic energy at the selected frequency. The thermal energy is associated with an activation energy of the selected material and one or more chemical precursors. Preferably, the thermal energy is also associated with a specific reaction temperature of the selected material and the one or more chemical precursors to form a film of material. As will be described, the method includes applying (step 511) one or more chemical precursors 703 overlying the substrate including the selected material excited at the plasmon resonant frequency to cause a selective deposition (step 513) of a film 801 overlying at least the portion of the selected material. Depending upon the embodiment, there can also be other steps. The method stops, at step 515. Of course, there can be other variations, modifications, and alternatives.

The above sequence of steps provides a method for forming a film of material according to an embodiment of the present invention. As shown, the method uses a combination of steps including a way of forming a film of material using electromagnetic radiation and a predefined patterned metallic nanostructure overlying a substrate. Other alternatives can also be provided where steps are added, one or more steps are removed, or one or more steps are provided in a different sequence without departing from the scope of the claims herein.

As merely an example, the present invention provides an alternative method for processing a film of material. The method includes irradiating one or more particles with an electromagnetic radiation source, the electromagnetic radiation source having a predetermined frequency. The method includes causing an increase in thermal energy on a portion of one or more of the particles to elevate a local temperature on the portion of the one or more particles. The increase in thermal energy is sufficient to initiate a chemical reaction of one or more species within a vicinity of the portion of the one or more particles. Of course, there can be other variations, modifications, and alternatives.

The above sequence of steps provides a method according to an embodiment of the present invention. Other alternatives can also be provided where steps are added, one or more steps are removed, or one or more steps are provided in a different sequence without departing from the scope of the claims herein. Further details of a system according to an embodiment of the present invention can be found throughout the present specification and more particularly below.

Figure 9:
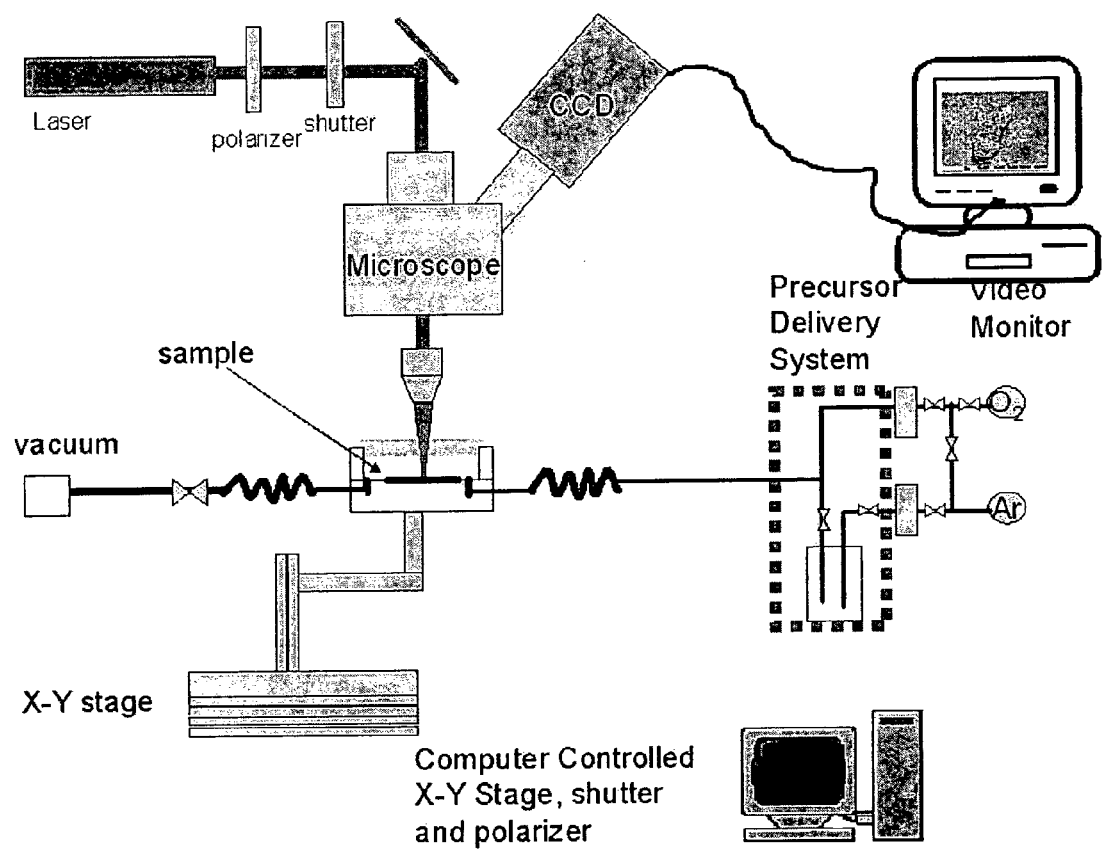
FIGS. 9 through 11 are simplified diagrams of an apparatus according to an embodiment of the present invention.
Figure 10:
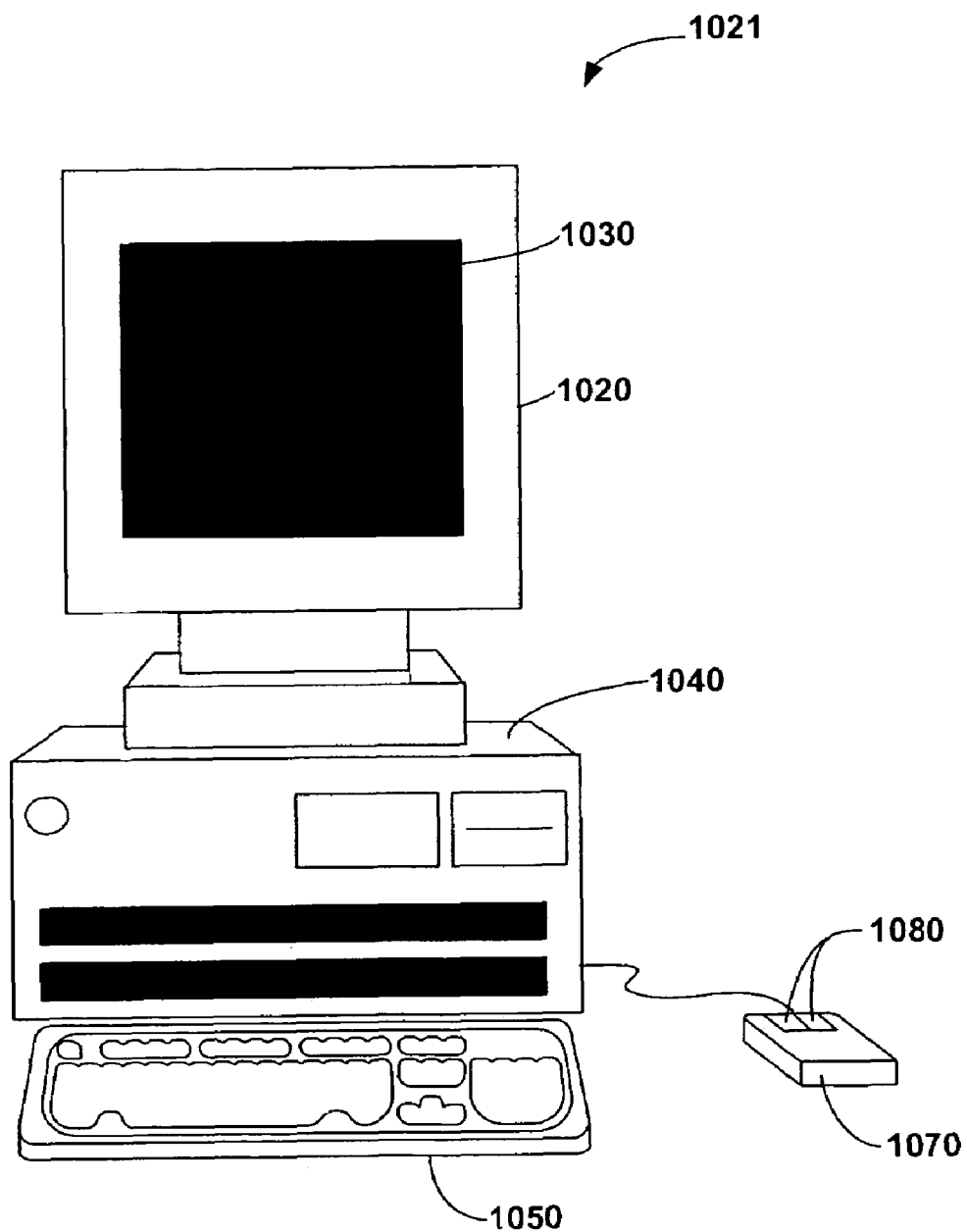
Figure 11:
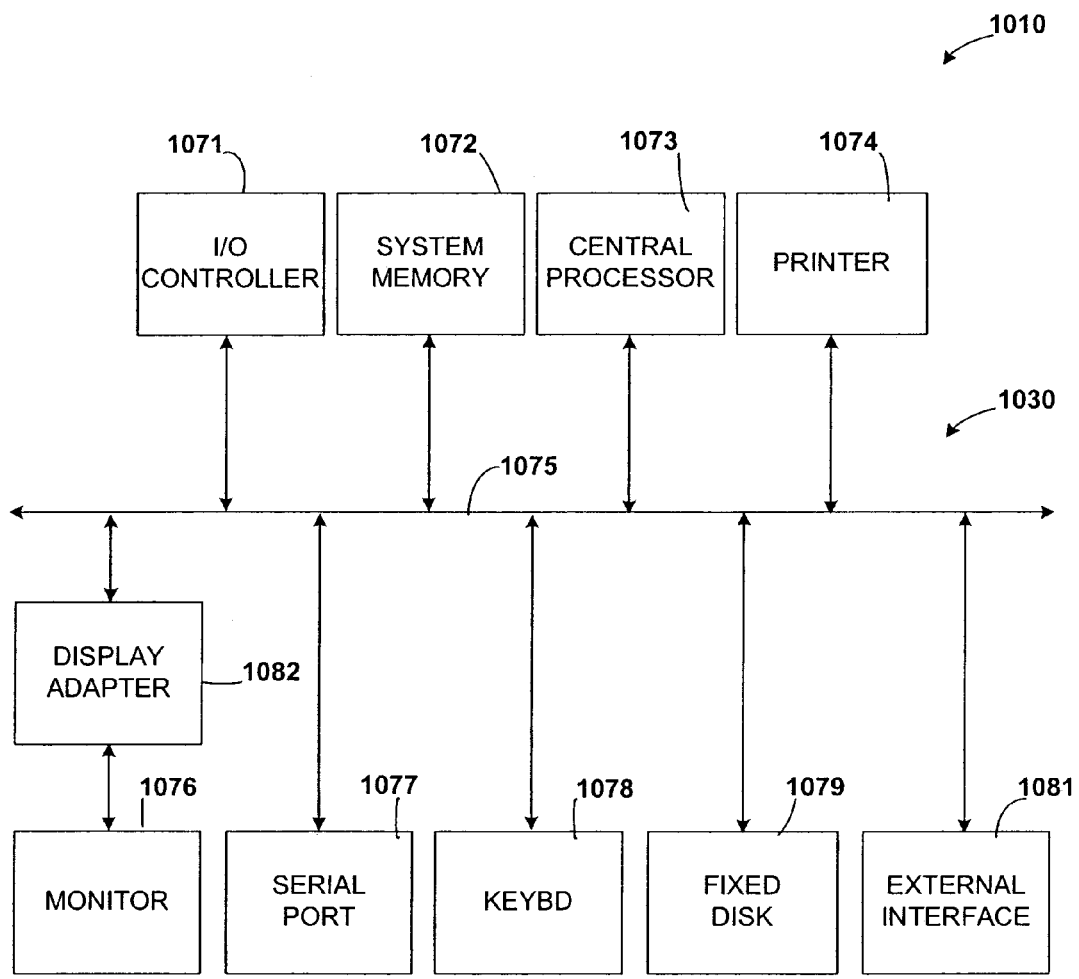

FIGS. 9 through 11 are simplified diagrams of an apparatus according to an embodiment of the present invention. These diagrams are merely examples, which should not unduly limit the scope of the claims herein. One of ordinary skill in the art would recognize many variations, alternatives, and modifications. Referring to FIG. 9, the present invention provides an apparatus 900 for processing a substrate according to an embodiment of the present invention. As shown, the apparatus includes a sample stage 901, which has a sample thereon. The sample stage is often an x-y stage and/or x-y-z stage, depending upon the specific embodiment. The sample stage is maintained in a chamber 903. Depending upon the embodiment, the chamber can be coupled to a vacuum pump 905 to create a vacuum environment. Alternatively, the chamber can be maintained at atmospheric pressure or elevated pressure, or any combination of these, depending upon the embodiment.

The apparatus includes an electromagnetic radiation source, such as laser source 909, according to a specific embodiment. Depending upon the embodiment, the laser source can be argon, helium, carbon dioxide, and others, including non-laser sources, or any combination of these. The laser source is coupled to polarizer 911, which is coupled to shutter 913, which mechanically and optically blocks the laser beam and/or allows the laser beam to traverse to the mirror 915. The mirror allows for certain adjustment of the laser beam depending upon the embodiment. The laser beam traverses through microscope 917 and focuses through collimator 921 toward a portion of a feature of a sample, depending upon the embodiment.

In a specific embodiment, the microscope is coupled to imaging capturing device 919. Preferably, the image capturing device is a charge coupled device (CCD) camera or the like depending upon the embodiment. In a specific embodiment, the CCD camera includes at least 160×120 pixel elements or more for high resolution. The CCD camera is coupled to video monitor 923, which includes a display and computing device, according to a specific embodiment. Also shown is computer system 1010, which is used to oversee the apparatus, according to a specific embodiment.

FIG. 10 is a simplified diagram of a computer system 1010 that is used to oversee the system of FIG. 9 according to an embodiment of the present invention. This diagram is merely an example, which should not unduly limit the scope of the claims herein. One of ordinary skill in the art would recognize many other modifications, alternatives, and variations. As shown, the computer system 1010 includes display device 1020, display screen 1030, cabinet 1040, keyboard 1050, scanner and mouse 1070. Mouse 1070 and keyboard 1050 are representative "user input devices." Mouse 1070 includes buttons 1080 for selection of buttons on a graphical user interface device. Other examples of user input devices are a touch screen, light pen, track ball, data glove, microphone, and so forth.

The system is merely representative of but one type of system for embodying the present invention. It will be readily apparent to one of ordinary skill in the art that many system types and configurations are suitable for use in conjunction with the present invention. In a preferred embodiment, computer system 1010 includes a Pentium™ class based computer, running Windows™ NT or XP operating system by Microsoft Corporation. The system, however, is easily adapted to other operating systems and architectures by those of ordinary skill in the art without departing from the scope of the present invention. As noted, mouse 1070 can have one or more buttons such as buttons 1080. Cabinet 1040 houses familiar computer components such as disk drives, a processor, storage device, etc. Storage devices include, but are not limited to, disk drives, magnetic tape, solid-state memory, bubble memory, etc. Cabinet 1040 can include additional hardware such as input/output (I/O) interface cards for connecting computer system 1010 to external devices external storage, other computers or additional peripherals, which are further described below.

FIG. 11 is a more detailed diagram of hardware elements in the computer system of FIG. 10 according to an embodiment of the present invention. This diagram is merely an example, which should not unduly limit the scope of the claims herein. One of ordinary skill in the art would recognize many other modifications, alternatives, and variations. As shown, basic subsystems are included in computer system 1010. In specific embodiments, the subsystems are interconnected via a system bus 1075. Additional subsystems such as a printer 1074, keyboard 1078, fixed disk 1079, monitor 1076, which is coupled to display adapter 1082, and others are shown. Peripherals and input/output (I/O) devices, which couple to I/O controller 1071, can be connected to the computer system by any number of means known in the art, such as serial port 1077. For example, serial port 1077 can be used to connect the computer system to a modem 1081, which in turn connects to a wide area network such as the Internet, a mouse input device, or a scanner. The interconnection via system bus allows central processor 1073 to communicate with each subsystem and to control the execution of instructions from system memory 1072 or the fixed disk 1079, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

In a preferred embodiment, the present invention provides a system for forming a film of material using chemical vapor deposition or other processes such as etching, and the like. The system has one or more memories with various computer codes to carry out the functionality described herein. The system has code directed to transferring a substrate comprising a pattern of at least one metallic nanostructure, the metallic nanostructure comprising a selected material, into a chamber. The system has code directed to exciting a portion of the selected material using an electromagnetic source having a predetermined frequency at a plasmon resonant frequency of the selected material to cause an increase in thermal energy of the selected material. The system also has code directed to applying one or more chemical precursors overlying the substrate including the selected material excited at the plasmon resonant frequency to cause selective deposition of a film overlying only the portion of the selected material while maintaining other regions of the substrate free from deposition. Depending upon the embodiment, there can be other variations, modifications, and alternatives.

Although the above has been illustrated in terms of specific hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application.

EXAMPLES

To prove the principles and operation of the present invention, we have provided examples of the invention in a chemical vapor deposition environment. Such examples are merely illustrative and should not unduly limit the scope of the claims herein. One of ordinary skill in the art would recognize many variations, modifications, and alternatives. As background information, we have provided certain information associated with conventional chemical vapor deposition and its application associated with the present method and systems. One of our goals of present CVD research is to locally control the nanostructure. Ferroelectric materials are highly desirable for non-volatile memory applications. However, there are challenges with fabrication a uniform nano-scale array of ferroelectric material. Conventional CVD provides only random deposition process and is therefore limited.

In the present example, instead of focusing a laser to locally heat the substrate as in LCVD, localized heating in the CVD environment is induced in metallic nanostructures, such as a particle, a wire, or arrays of these, on a substrate by exciting a plasmon resonance in these structures. A plasmon resonance occurs when light waves interacts with delocalized electrons in the metal, and at the resonant frequency, a substantial portion incident energy of the light is absorbed by the particle causing heating. Suitable temperatures for CVD growth are attainable with modest light intensities.

Figure 12:
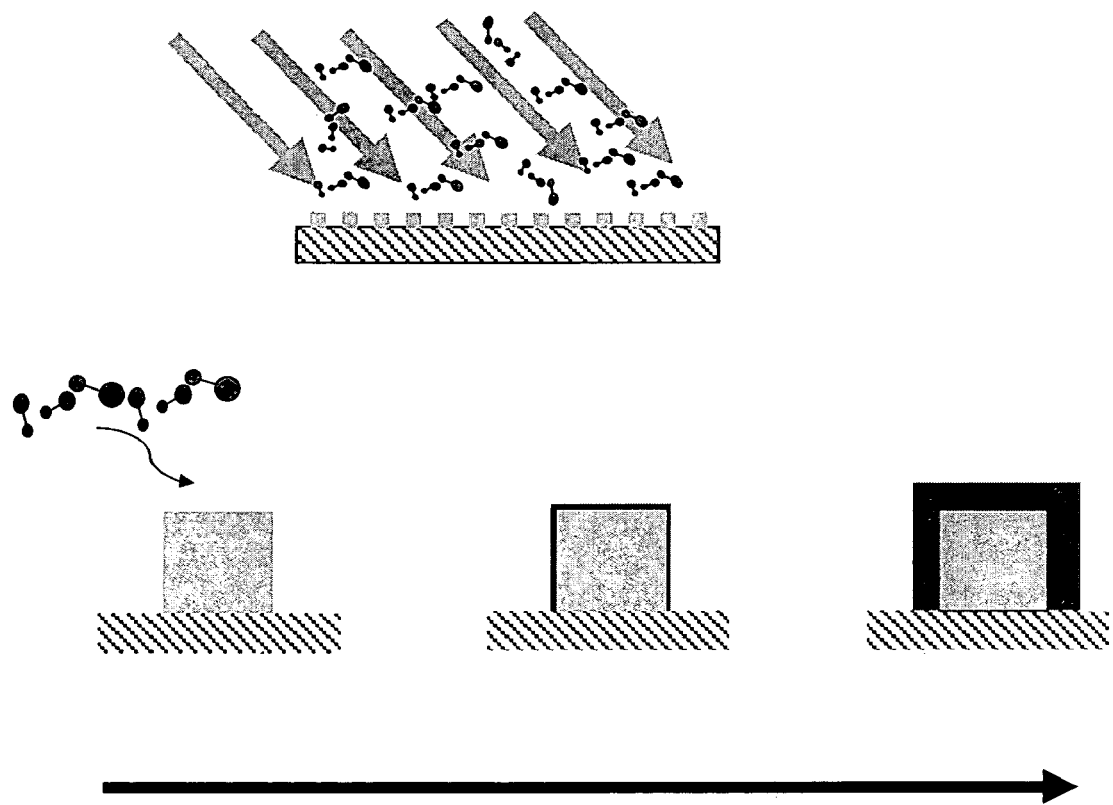
FIGS. 12 through 14 are illustrations of processes associated with examples according to embodiments of the present invention.
Figure 13:
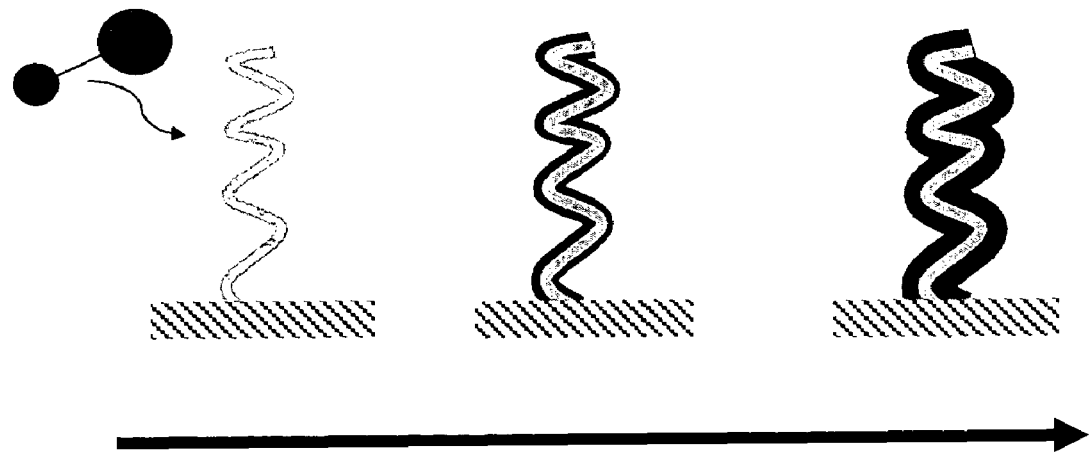
Figure 14:
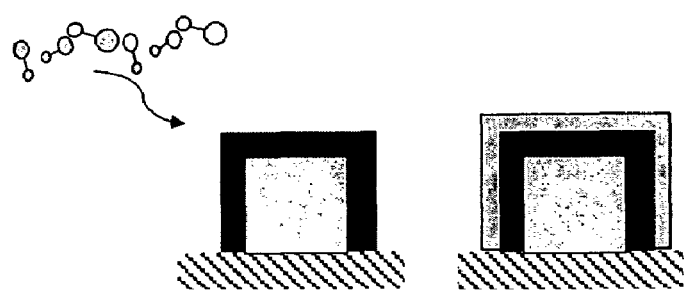

A schematic of the process is shown in FIG. 12: Incident light (green arrows) excites a plasmon resonance in an array of metallic nanoparticles (red) on a substrate in a CVD environment. The particles are heated and deposition (dark green) occurs only on the heated particles. (Bottom is an expanded view.) It is also possible to grow on complex 3-d metallic structures such as a coiled wire, FIG. 13. The use of metallic underlying structures is advantageous for ferroelectrics because the underlying metal can act as a necessary electrode. It would be possible to deposit a capacitor device (metal-dielectric-metal) in a single growth process without etching, FIG. 14. Other examples of methods according to the present invention can be found below.

In yet an alternative example, we have formed various nanostructures using chemical vapor deposition techniques. We have demonstrated CVD of $TiO_2$ directly on a 10, 20, and 40 nm Au nanoparticles. Of course, there can be other variations, modifications, and alternatives.

Figure 15:
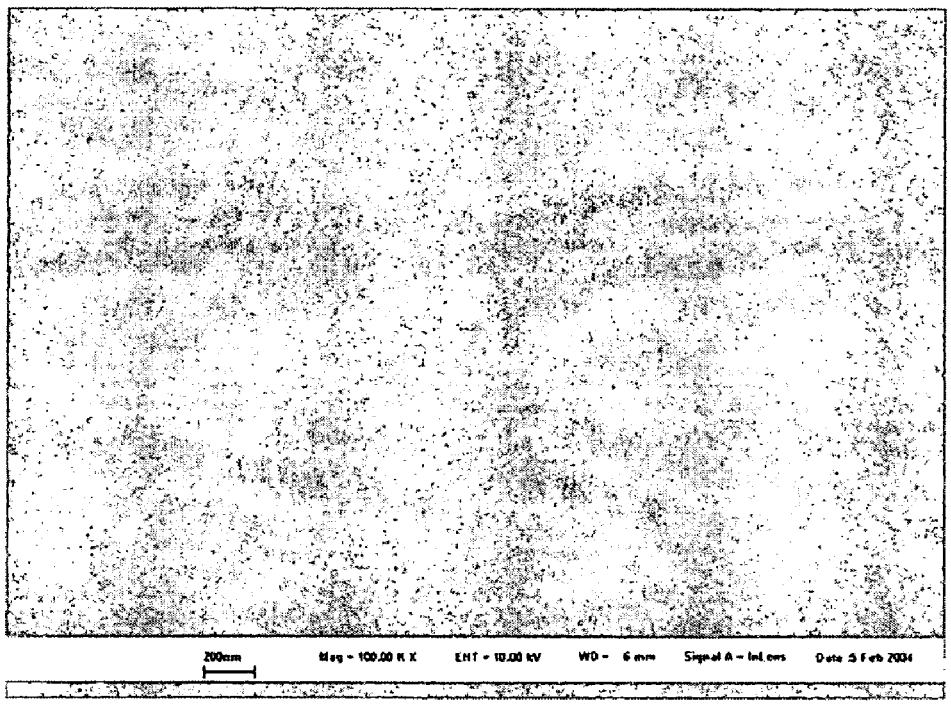
FIGS. 15 through 19 are illustrations of processes associated with examples according to alternative embodiments of the present invention.

To our knowledge, this is the first application of plasmon heating to CVD, and we apply the name of plasmon assisted CVD (PACVD). The laser power density for the depositions was several of orders of magnitude lower than conventional laser assisted CVD. Nanoparticles with diameters of 10, 20, and 40 nm, were deposited from solution on to a Si wafer, and shown in FIG. 15 are SEM images of the as-deposited particles. The depositions are random with densities of about 100 particles/µm2.

Figure 16:
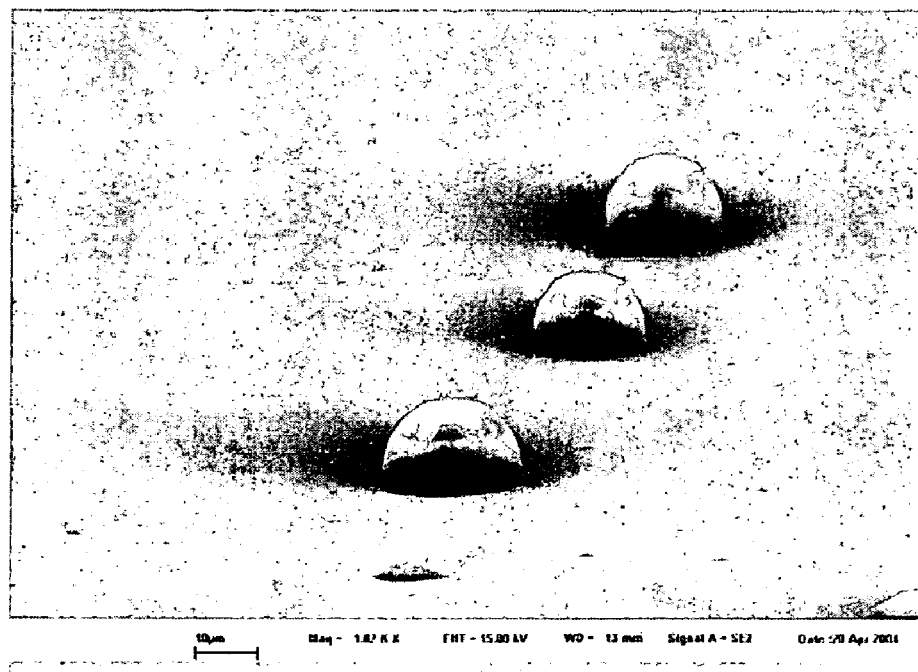
Figure 17:
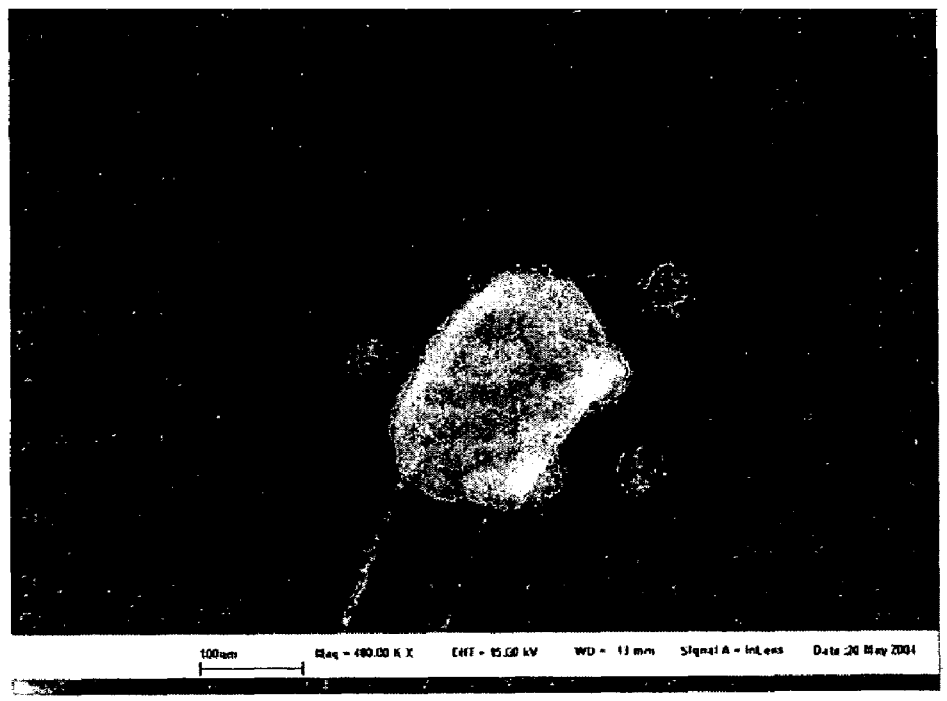
Figure 18:
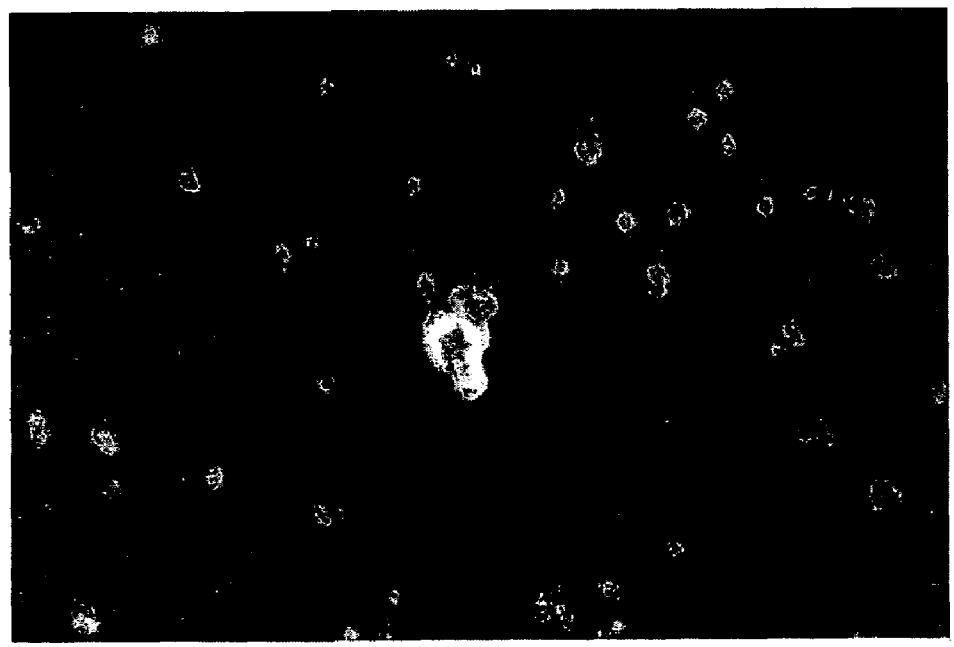
Figure 19:
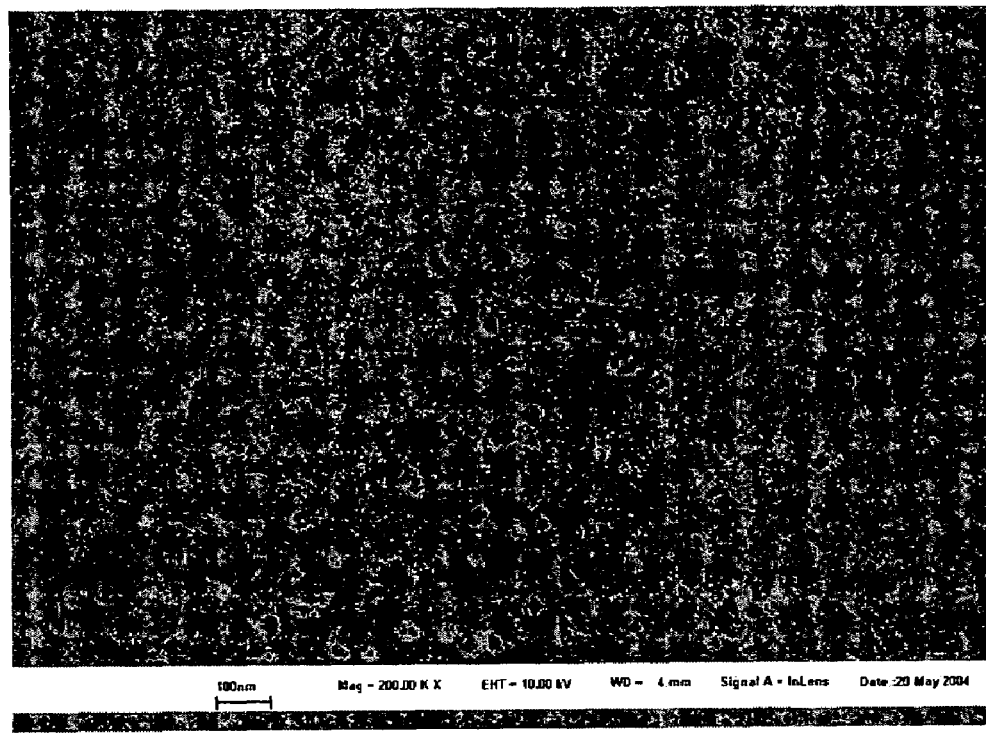

These wafers were placed in our micro CVD reactor, such as the one shown above, but can be others. The precursor was $Ti[(OCH(CH_3)_2]_2[C_{11}H_{19}O_2]_2$ which was chosen because of its high vapor pressure at relatively low temperatures. The plasmon resonance of the 20 nm Au particles on a Si wafer is 640 nm. (It should be noted that the thin, native layer of $SiO_2$ was not removed.) A HeNe laser beam (632 nm) was focused with 10× microscope objective to a spot size of close to 10 µm. The sample cell was mounted on a computer controlled XY translation stage. The laser power was varied from 10 to 100/AW by adjusted a rotating polarizer in the beam path. An electronic shutter was also placed in the beam path to control the exposure. A LabView program controlled the position, the exposure, and the laser power, and recorded the bubbler and cell temperatures, and the cell pressure. A grid of 500 exposure areas was created with increasing exposure time left to write and increasing laser power from top to bottom. The partial pressures of the $Ti[(OCH(CH_3)_2]_2[C_{11}H_{19}O_2]_2)$ precursor and oxygen were taken from LCVD literature. The bubbler was kept at 130° C. and a small amount of Ar was flowed to reach a pressure of 1.5 milli-barr in the cell. A of flow of $O_2$ increased the cell pressure to 2.0 mbarr. The size of the deposits varied depending on the particle size, power, and exposure. The deposits range in size from the micro to nano scale. Shown in FIG. 16 are SEM images of the micron sized depositions from the first run on 20 nm Au particles. This array of deposits are presumably where the exposure and power were high, and micron sized features are not unreasonable. The beam spot is ~10 µm and $TiO_2$ has a negligible absorption at 632 nm and a high thermal conductivity. Raman spectroscopy verified that many of the features are indeed $TiO_2$ in the anatase and rutile forms, while some of the deposits are believed to contain a mixture of $TiO_2$ and unreacted precursor. In this sample, we observed deposits that were rods of 10 µm in diameter and 40 µm in height. FIG. 17 shows nanoscale deposit on similar 20 nm particles made with presumably lower power and exposure. FIG. 18 shows nanoscale deposition on a 40 nm Au particle. FIG. 19 shows a range of nanoscale deposits on 10 nm Au particles. Accordingly, we have verified certain methods using the above examples according to embodiments of the present invention. These examples are merely illustrations and should not limit the scope of the claims herein. One of ordinary skill in the art would recognize many variations, modifications, and alternatives.

Depending upon the specific embodiment, there may be pronounced heating effects from certain interactions. There are pronounced heating effects from photon-electron interactions in nanoparticles as compared to bulk structures. The temperature of a metal is related to the average kinetic of the conduction electrons, and incident electromagnetic radiation will cause oscillations of electrons in the surface region of a metal, thereby increasing the average kinetic energy. The kinetic energy of the surface electrons is eventually transferred in a somewhat random fashion to electrons outside of the surface, bulk electrons. This is the basis of radiative heating. If however, the electromagnetic radiation is at the plasmon resonance frequency, there will be collective oscillations or a resonance of the surface electrons, and the heating will be maximized. It is not possible to excite such a resonance in bulk electrons, which dominate macroscopic structures. A non-resonant frequency of light will cause heating; however it will not do so as efficiently as using a resonant frequency.

As the size of a structures decreases, there is an increase in the surface-to-volume, ratio, which is proportional to 1/R, where R is the radius of the particle. Nanoparticles, in particular, have high surface-to-volume ratios so that there are a larger number of surface electrons relative to bulk electrons. It is generally believed that this accounts for the efficient heating of nanoparticles by electromagnetic radiation at the plasmon resonance frequency.

Figure 20:
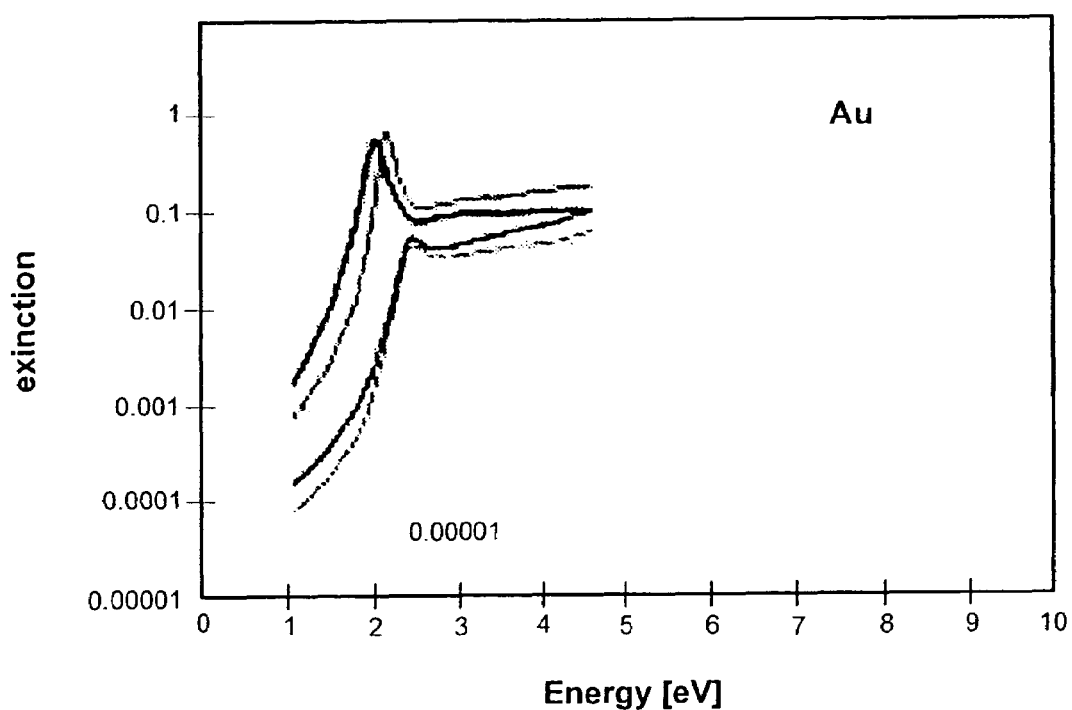
FIG. 20 is a simplified plot of extinction spectra of gold nanoparticles versus energy according to a specific embodiment of the present invention.

In order to explain the plasmon resonance influence, we have presented certain optical extinction spectra of gold nanoparticles, which support our findings. FIG. 20 is a simplified plot of extinction spectra of gold nanoparticles versus energy according to a specific embodiment of the present invention. This diagram is merely an illustration and should not unduly limit the scope of the claims herein. One of ordinary skill in the art would recognize many variations, modifications, and alternatives. Extinction has been plotted against energy for single, spherical clusters, calculated using Mie theory including multi poles up to L<=10. As you can see, there is nearly an order of magnitude increase in the extinction near the resonance. The optical extinction takes into account the absorption and the scattering of light. Regardless, of how it is divided between scattering and absorption, heating has been maximized at the resonant frequency, which supports our findings. Although we believe that such mechanism exists, there may also be other variations, modifications, and alternatives, depending upon the embodiment.

Additionally, certain preferred embodiments described above are in terms of deposition, other techniques may also be used. For example, the present invention may also be applied to etching layers, which have been deposited by conventional CVD (or plasmon assisted-CVD, which has been described herein) on top of the pre-form (the substrate on which particles have been distributed in a desired pattern). In a specific embodiment, after the layer to be etched has been deposited, one can use the present invention to cause a local increase in temperature (and/or electric field) in the vicinity of the particles of the pre-form, which causes the deposited layer to be removed in the vicinity of the particles through melting, sublimation, or some other physical effect. Of course, there can be other variations, modifications, and alternatives.

It is also understood that the examples and embodiments described herein are for illustrative purposes only. As described above, the present invention allows for the direct deposition of a structured film with a spatial scale and characteristic provided by a geometric feature of the pre-form according to a specific embodiment. Although deposition has been described, other forms of chemical reaction can also be provided using the present technique for selectively increasing a temperature of a particle and/or pre-form structure according to a specific embodiment. Various modifications or changes in light thereof will be suggested to persons skilled in the art and are to be included within the spirit and purview of this application and scope of the appended claims.

What is claimed is:

1. A method for forming a film of material using plasmon assisted chemical vapor deposition, the method comprising:
   providing a substrate comprising a surface region;
   forming one or more particles overlying a portion of the surface region, the one or more particles having a thermal characteristic and comprising a metallic material, wherein the metallic material is selected from gold, copper, silver, titanium, aluminum, Ni, Pd, Pt, Rh, Ir, and Fe;
   applying a reactive species within a vicinity of the one or more particles;
   irradiating the one or more particles with electromagnetic radiation, the electromagnetic radiation having a pre-selected frequency based on a plasmon resonating effect;
   increasing a temperature of the one or more particles having the thermal characteristic to at least a selected temperature from an influence of at least the electromagnetic radiation having the pre-selected frequency, the influence comprising the plasmon resonating effect causing an increase in thermal energy of the one or more particles; and
   causing a chemical reaction of the reactive species from at least the increase in the temperature of the one or more particles to initiate formation of a film of material from the reactive species.

2. The method of claim 1 wherein the electromagnetic radiation is from a laser source.

3. The method of claim 1 wherein the pre-selected frequency ranges from about 200 nanometers to about 30,000 nanometers.

4. The method of claim 1 wherein the surface comprises silicon bearing material.

5. The method of claim 1 wherein the one or more particles is characterized by a length of one nanometers to about 100 nanometers.

6. The method of claim 1 wherein the chemical reaction is initiated by a predetermined temperature.

7. The method of claim 1 wherein the reactive species contacts the one or more particles.

8. The method of claim 1 wherein the surface region comprises a pattern from the one or more particles, the pattern is characterized as a pre-form structure, the pre-form structure is either on or embedded in the substrate.

9. The method of claim 1 further comprising forming the film of material to a selected thickness.

10. The method of claim 1 wherein the reactive species is in gaseous form.

11. The method of claim 1 wherein the reactive species is in liquid form.

12. The method of claim 1 wherein the reactive species is in a plasma.

13. The method of claim 1 wherein the reactive species is in solid form.

14. The method of claim 1 further comprising maintaining the substrate at a predetermined temperature.

15. The method of claim 1 wherein the selected temperature is a reaction temperature of the reactive species.

16. A method for causing a chemical reaction for forming a film of material using electromagnetic radiation, the method comprising:
providing one or more particles, the one or more particles having a thermal characteristic and comprising a metallic material, wherein the metallic material is selected from gold, copper, silver, titanium, aluminum, Ni, Pd, Pt, Rh, Ir, and Fe;
applying a reactive species within a vicinity of the one or more particles;
irradiating the one or more particles with electromagnetic radiation, the electromagnetic radiation having a pre-selected frequency based on a plasmon resonating effect;
increasing a temperature of the one or more particles having the thermal characteristic to at least a selected temperature from an influence of at least the electromagnetic radiation having the pre-selected frequency, the influence comprising the plasmon resonating effect of the one or more particles, the plasmon resonating effect causing an increase in thermal energy of the one or more particles;
causing a chemical reaction of the reactive species from at least the increase in the temperature of the one or more particles to initiate formation of a material from the reactive species.

17. The method of claim 16 wherein the electromagnetic radiation is from a laser source.

18. The method of claim 16 wherein the pre-selected frequency ranges from about 200 nanometers to about 30,000 nanometers.

19. The method of claim 16 wherein the one or more particles are provided on a surface region of a substrate.

20. The method of claim 16 wherein the one or more particles is characterized by a length of one nanometers to about 100 nanometers.

21. The method of claim 16 wherein the chemical reaction is initiated at the selected temperature.

22. The method of claim 16 wherein the reactive species contacts the one or more particles.

23. The method of claim 16 further comprising forming the film of material to a selected thickness.

24. The method of claim 16 wherein the reactive species is in gaseous form.

25. The method of claim 16 wherein the reactive species is in liquid form.

26. The method of claim 16 wherein the reactive species is in a plasma.

27. The method of claim 16 wherein the selected temperature is a reaction temperature associated with the reactive species.

28. A method for processing materials using chemical reactions, the method comprising:
irradiating one or more particles with an electromagnetic radiation source, the electromagnetic radiation source having a predetermined frequency based on a plasmon resonating effect, wherein the one or more particles comprise a metallic material and wherein the metallic material is selected from gold, copper, silver, titanium, aluminum, Ni, Pd, Pt, Rh, Ir, and Fe;
causing an increase in thermal energy on a portion of one or more of the particles to elevate a local temperature on the portion of the one or more particles by the plasmon resonating effect of the one or more particles from the predetermined frequency of the electromagnetic radiation source; and
whereupon the increase in thermal energy is sufficient to initiate a chemical reaction of one or more species within a vicinity of the portion of the one or more particles.

29. The method of claim 28 wherein the electromagnetic radiation is from a laser source.

30. The method of claim 28 wherein the predetermined frequency ranges from about 200 nanometers to about 30,000 nanometers.

31. The method of claim 28 wherein the one or more particles are provided on a surface region of a substrate.

32. The method of claim 28 wherein the one or more particles is characterized by a length of one nanometers to about 100 nanometers.

33. The method of claim 28 wherein the chemical reaction is initiated at a selected temperature.

34. The method of claim 28 wherein the one or more species is in gaseous form.

35. The method of claim 28 wherein the one or more species is in liquid form.

36. The method of claim 28 wherein the one or more species is in a plasma.

37. The method of claim 28 wherein the portion of the one or more particles is an entirety of the one or more particles.

38. The method of claim 28 wherein the portion of the one or more particles is a local region of the one or more particles.

39. The method of claim 28 wherein an elevated local temperature is a reaction temperature.

40. A method for forming a film of material using chemical vapor deposition, the method comprising:
providing a substrate comprising a pattern of at least one metallic nanostructure, the metallic nanostructure comprising a selected material, wherein the selected material is gold, copper, silver, titanium, aluminum, Ni, Pd, Pt, Rh, Ir, and Fe;
determining a plasmon resonant frequency of the selected material of the nanostructure;
exciting a portion of the selected material using an electromagnetic source having a predetermined frequency at the plasmon resonant frequency to cause an increase in thermal energy of the selected material; and
applying one or more chemical precursors overlying the substrate including the selected material excited at the plasmon resonant frequency; and
causing selective deposition of a film overlying at least the portion of the selected material.

41. The method of claim 40 wherein the selective deposition is caused by a predetermined temperature of the selected material from the increase in thermal energy.

42. The method of claim 40 wherein the substrate is maintained in a chamber.

43. The method of claim 40 wherein the film of material is a ferroelectric film.

44. The method of claim 40 wherein the one or more chemical precursors are applied during the exciting of the selected material at the plasmon resonant frequency.

45. The method of claim 40 wherein the portion of the selected material is an entirety of the nanostructure.

46. The method of claim 28 wherein the vicinity of the one or more particles is on and in contact with the one or more particles.

47. The method of claim 40 wherein the electromagnetic radiation is from a laser source.

48. The method of claim 40 wherein the predetermined frequency ranges from about 200 nanometers to about 30,000 nanometers.

49. The method of claim 40 wherein the nanostructure is characterized by a length of one nanometers to about 100 nanometers.

50. The method of claim 40 wherein the one or more chemical precursors is in gaseous form.

51. The method of claim 40 wherein the one or more chemical precursors is in a plasma.

52. The method of claim 40 wherein the substrate is maintained at a temperature of about room temperature and less.

53. The method of claim 40 wherein the increase in thermal energy is local on the selected material.

* * * * *

UNITED STATES PATENT AND TRADEMARK OFFICE
CERTIFICATE OF CORRECTION

PATENT NO. : 7,504,136 B2  Page 1 of 1
APPLICATION NO. : 11/006457
DATED : March 17, 2009
INVENTOR(S) : Boyd et al.

It is certified that error appears in the above-identified patent and that said Letters Patent is hereby corrected as shown below:

Please delete after the STATEMENT AS TO RIGHTS TO INVENTIONS MADE UNDER FEDERALLY SPONSORED RESEARCH OR DEVELOPMENT Section (column 1 line 15)

insert

--The U.S. Government has certain rights in this invention pursuant to Grant No. DAAD19-01-1-0517, funded by the Army Research Office.--

Signed and Sealed this

Second Day of June, 2009

JOHN DOLL
*Acting Director of the United States Patent and Trademark Office*